United States Patent [19]

Henson et al.

[11] Patent Number: 5,384,494
[45] Date of Patent: Jan. 24, 1995

[54] PROGRAMMABLE HOLD-OFF FOR INTEGRATED CIRCUIT I/O PINS

[75] Inventors: Bradley S. Henson, Lakewood; William D. Farwell, Thousand Oaks, both of Calif.

[73] Assignee: Hughes Aircraft Company, Los Angeles, Calif.

[21] Appl. No.: 48,723

[22] Filed: Apr. 13, 1993

[51] Int. Cl.6 ............................................. H03K 3/289
[52] U.S. Cl. ................................. 327/202; 327/261
[58] Field of Search ............... 307/272.1, 272.2, 603, 307/602, 480; 328/206

[56] References Cited

U.S. PATENT DOCUMENTS

| | | | |
|---|---|---|---|
| 4,864,161 | 9/1989 | Norman et al. | 307/272.2 |
| 4,926,451 | 5/1990 | Yoshihara et al. | 307/271 |
| 5,015,875 | 5/1991 | Giles et al. | 307/272.2 |
| 5,124,573 | 5/1992 | Wong | 307/605 |
| 5,130,568 | 7/1992 | Miller et al. | 307/272.2 |
| 5,148,052 | 9/1992 | Yellamilli | 307/272.1 |
| 5,175,447 | 12/1992 | Kawasaki et al. | 307/272.2 |
| 5,216,302 | 6/1993 | Tanizawa | 307/603 |
| 5,257,223 | 10/1993 | Dervisoglu | 307/272.2 |
| 5,281,864 | 1/1994 | Hahn et al. | 307/272.2 |

Primary Examiner—Timothy P. Callahan
Assistant Examiner—T. T. Lam
Attorney, Agent, or Firm—L. A. Alkov; W. K. Denson-Low

[57] ABSTRACT

A programmable hold-off circuit for an integrated circuit for selectively providing hold-off for outputs of the integrated circuit. The programmable hold-off circuit includes a hold-off latch for receiving an output signal from the interior logic of the integrated circuit, and for providing a hold-off latch output, an output buffer responsive to hold-off latch output for providing a buffered output, a hold-off control circuit responsive to a hold clock for controlling the hold-off latch to be continuously transparent when the hold-off control circuit is programmed for no hold-off, and for controlling the hold-off latch pursuant to the hold clock when the hold-off control circuit is programmed for hold-off. The hold-off control circuit is programmed, for example, pursuant to a boundary scan flip-flop.

2 Claims, 2 Drawing Sheets

PROGRAMMABLE HOLD-OFF FOR INTEGRATED CIRCUIT I/O PINS

BACKGROUND OF THE INVENTION

The disclosed invention is directed generally to hold-off circuits, and more particularly to a programmable hold-off circuit for integrated circuit output pins.

In integrated circuit design, hold-off is a commonly used technique by which an output of an integrated circuit is delayed for a fixed minimum period of time after the active clock transition in order to assure that the signal at the input of a receiving flip-flop is stable for a time interval that is equal to or exceeds the hold-time requirement of such receiving flip-flop. Hold-off is conventionally implemented in the hardware design of integrated circuit. However, where an integrated circuit is intended for use in multiple applications, there may be some applications where hold-off is required for particular outputs and some where hold-off is not required for outputs. This is due to the unique path delays and clock skews of the various applications. Since a fixed hold-off time adds to the propagation delay between registers, it is desirable to use hold-off only when necessary to assure sufficient hold time margin. Since hold-off is currently being implemented by hardware design, detailed analysis is required prior to finalizing the design of an integrated circuit in which hold-off is being implemented, and hold-off is probably being unnecessarily implemented as a conservative measure.

SUMMARY OF THE INVENTION

It would therefore be an advantage to provide programmable hold-off for an integrated circuit output so that hold-off can be disabled or enabled as required for a particular application.

The foregoing and other advantages are provided by the invention in a programmable hold-off circuit for an integrated circuit for selectively providing hold-off for outputs of the integrated circuit. The programmable hold-off circuit includes a hold-off latch for receiving an output signal from the interior logic of the integrated circuit, and for providing a hold-off latch output, an output buffer responsive to hold-off latch output for providing a buffered output, a hold-off control circuit responsive to a hold clock for controlling the hold-off latch to be continuously transparent when the hold-off control circuit is programmed for no hold-off, and for controlling the hold-off latch pursuant to the hold clock when the hold-off control circuit is programmed for hold-off. The hold-off control circuit is programmed, for example, pursuant to a boundary scan flip-flop.

BRIEF DESCRIPTION OF THE DRAWINGS

The advantages and features of the disclosed invention will readily be appreciated by persons skilled in the art from the following detailed description when read in conjunction with the drawing wherein.

DETAILED DESCRIPTION OF THE DISCLOSURE

Figure 1:
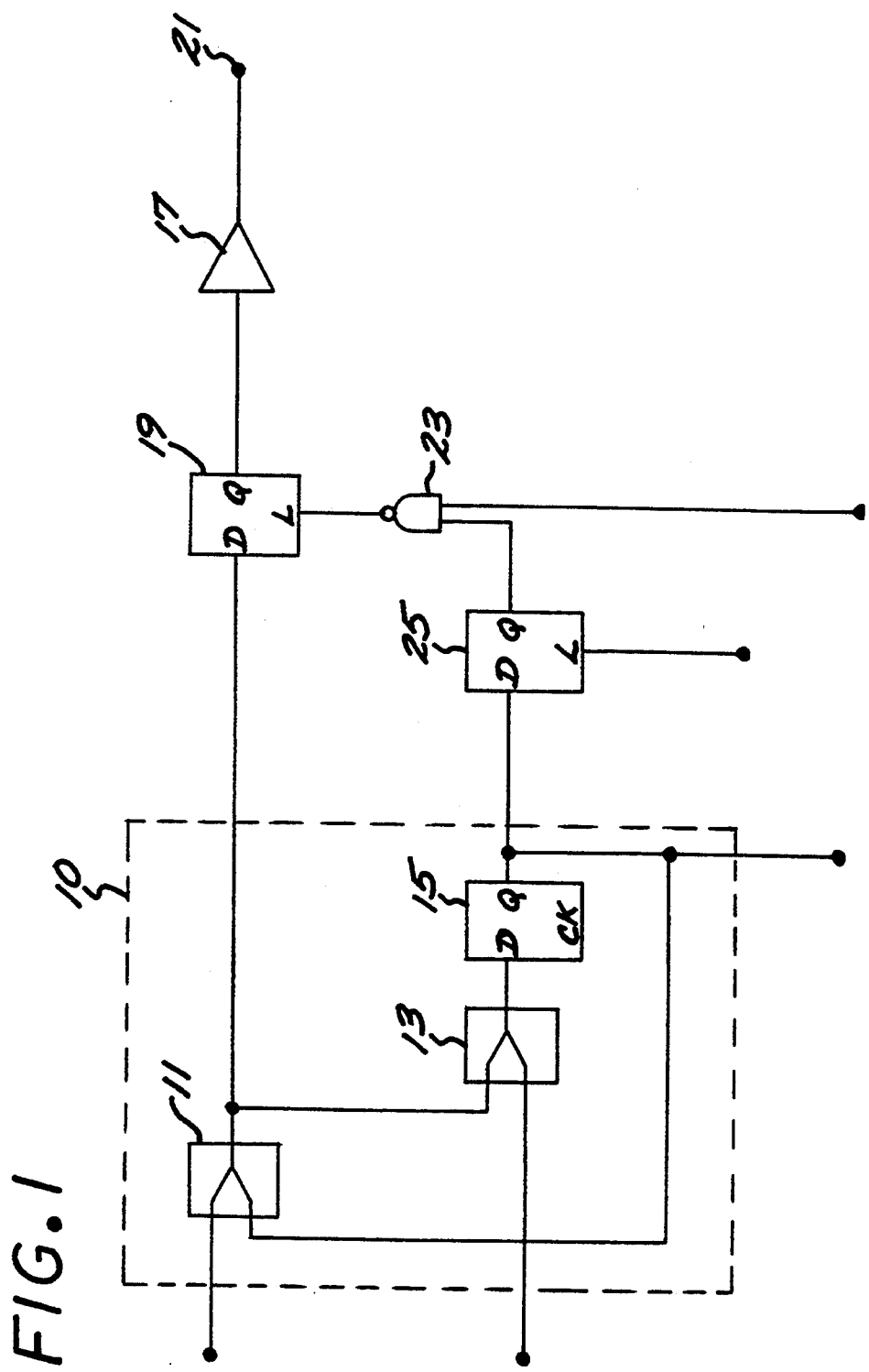
FIG. 1 is a schematic block diagram of a programmable hold-off circuit in accordance with the invention.

In the following detailed description and in the several figures of the drawing, like elements are identified with like reference numerals.

Referring now to FIG. 1, set forth therein is schematic diagram of a programmable hold-off circuit for providing programmable hold-off for an integrated circuit output in accordance with the invention. The programmable hold-off circuit includes a conventional boundary scan cell 10 comprised of a first 2-to-1 output multiplexer 11, a 2-to-1 scan multiplexer 13, and a scan flip-flop 13. One input to the output multiplexer 11 is provided by output data from interior logic of the integrated circuit in which the hold-off circuit of FIG. 1 is implemented. The other input to the output multiplexer 11 is provided by the Q output of the scan flip-flop 15 whose D input is provided by the output of the scan multiplexer 13. The Q output of the scan flip-flop 15 is further provided as the input to the scan multiplexer next in sequence in a scan chain in which the scan cell 11 is implemented or as the serial output of such scan chain. One input to the scan multiplexer 13 is provided by the output of the output multiplexer 11, while its other input is provided by the Q output of the scan flip-flop prior in sequence in the scan chain in which the scan cell 11 is implemented or by the external serial input to such scan chain. In accordance with conventional techniques, the scan flip-flop 15 and the other scan flip-flops in the chain in which the scan flip-flop 15 is implemented are clocked by the data clock of the integrated circuit containing such chain or by a separate test clock.

The programmable hold-off circuit of FIG. 1 further includes an output buffer 17 which receives its input from the Q output of a hold-off latch 19 and provides its output to an associated output pin 21. The input to the D input of hold-off latch 19 is provided by the output of the output multiplexer 11 while the input to the latch control input L of the hold-off latch 19 is provided by the output of a NAND gate 23. The hold-off latch 19 is transparent when the input to its latch control input L is a 1, and is latched when the input to its latch control input L is a 0. One input to the NAND gate 23 is provided by a hold-off clock signal HCLK, while the other input to the NAND gate is provided by the Q output of a hold select latch 25. The input to the D input of the hold select latch 25 is provided by the output of the Q output of the scan flip-flop 15 while the input to the latch control input L of the hold select latch 25 is provided by a SELECT LATCH control signal. The hold select latch 25 is transparent when the input to its latch control input L is a 1, and is latched when the input to its latch control input L is a 0.

In use, respective hold-off circuits as shown in FIG. 1 are respectively implemented for each of selected output pins of an integrated circuit, and such hold-off circuits are connected in a serial scan chain via the serial connections of the scan flip-flops of the scan cells of the hold-off circuits. As implemented in a serial scan chain, each hold Off circuit is programmed as follows.

1. On initialization of a system that includes the integrated circuit containing hold-off circuits in accordance with FIG. 1, the SELECT LATCH control signal is set to 0, and a hold-off value is scanned into the flip-flop of the boundary scan cell of the hold-off circuit. For the particular logic elements of FIG. 1, the hold-off is a 0 if hold-off is to be disabled, and a 1 if hold-off is to be enabled.

2. The SELECT LATCH control signal input to the hold select latch is then momentarily toggled from 0 to 1 and then back to 0. This causes the scanned-in hold-off value to be latched into the hold select latch. The hold-off is now programmed, and will remain so as long as the SELECT LATCH control signal remains at 0.

Figure 2:
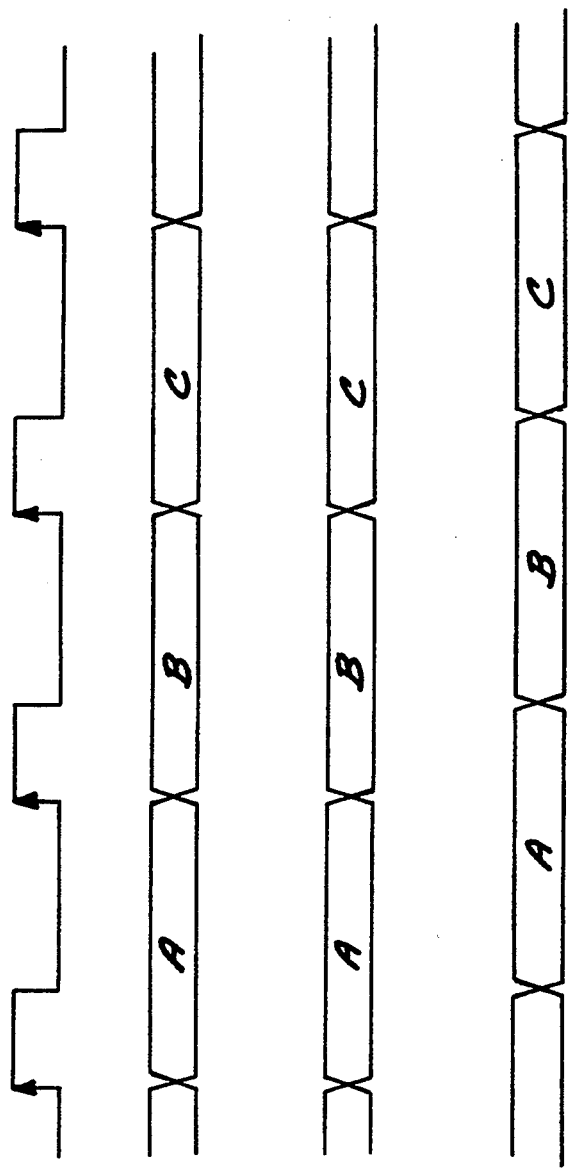
FIG. 2 is a timing diagram illustrating the operation of the programmable hold-off circuit of FIG. 1.

Referring now to FIG. 2, set forth therein is a timing diagram illustrating the operation of the hold-off circuit when hold-off is disabled, and when hold-off is enabled, for the particular example wherein the data clock for the integrated circuit is utilized as the hold clock signal. In particular, when hold-off is disabled, the output of the output buffer 19 is not delayed relative to the input to the hold-off latch since the hold-off latch is continuously transparent when hold-off is disabled. When hold-off is enabled, the output of the output buffer is delayed relative to the input to the hold-off latch by the time interval between the active transition of the hold clock and the subsequent non-active transition. In other words, when hold-off is enabled, the hold-off latch is latched during the time interval between the active clock transition and the subsequent non-active transition, and is transparent between the non-active clock transition and the subsequent active clock transition, which causes the hold-off latch output to be delayed relative to its input.

The hold clock HCLK comprises an appropriate clock signal that is configured to provide a pulse width (e.g., between active and inactive clock transitions in the foregoing example) that provides the desired delay for an output signal to assure that the hold time requirement of the receiving device is met. By way of illustrative example, the hold clock signal can comprise the data clock of the integrated circuit, or it can be a separate clock signal that is synchronized with the data clock.

The foregoing has been a disclosure of a programmable hold off circuit for integrated circuit outputs that advantageously allows for hold off to be selectively enabled or disabled, as required by a particular application or variation in output load conditions.

Although the foregoing has been a description and illustration of specific embodiments of the invention, various modifications and changes thereto can be made by persons skilled in the art without departing from the scope and spirit of the invention as defined by the following claims.

What is claimed is:

1. A hold-off circuit for an integrated circuit having interior logic, comprising:

a hold-off latch for receiving an output signal from the interior logic of the integrated circuit, and for providing a hold-off latch output;

an output buffer responsive to said latch output for providing a buffered output;

a hold select latch for storing a hold-off value indicative of whether hold-off is on or off, and for providing a hold select latch output; and gating means responsive to said hold select latch output and a hold clock for controlling said hold-off latch;

said hold-off latch being transparent regardless of the state of the hold clock when said hold select latch is storing a hold-off value indicative of hold-off being not on, and said hold-off latch being controlled by said hold clock when said hold select latch is storing a hold-off value indicative of hold-off being on.

2. The hold circuit of claim 1 further including a scan flip-flop having an output connected to the input of said hold select latch for providing said hold-off value to said hold select latch.

* * * * *